US009653563B2

(12) United States Patent
Liaw

(10) Patent No.: US 9,653,563 B2
(45) Date of Patent: May 16, 2017

(54) CONNECTION STRUCTURE FOR VERTICAL GATE ALL AROUND (VGAA) DEVICES ON SEMICONDUCTOR ON INSULATOR (SOI) SUBSTRATE

(71) Applicant: Taiwan Semiconductor Manufacturing Company Limited, Hsinchu (TW)

(72) Inventor: Jhon-Jhy Liaw, Hsinchu County (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 223 days.

(21) Appl. No.: 14/256,122

(22) Filed: Apr. 18, 2014

(65) Prior Publication Data
US 2015/0303270 A1    Oct. 22, 2015

(51) Int. Cl.
*H01L 27/00* (2006.01)
*H01L 29/423* (2006.01)
(Continued)

(52) U.S. Cl.
CPC .... *H01L 29/42392* (2013.01); *H01L 27/1211* (2013.01); *H01L 29/0676* (2013.01);
(Continued)

(58) Field of Classification Search
CPC ........... H01L 27/1211; H01L 29/42392; H01L 2027/11879; H01L 29/0676;
(Continued)

(56) References Cited

U.S. PATENT DOCUMENTS

2011/0024828 A1* 2/2011 Takeuchi ............ H01L 27/0207
257/329
2011/0299325 A1* 12/2011 Kim ..................... G11C 11/412
365/156

FOREIGN PATENT DOCUMENTS

JP    2011-018825    1/2011
KR    20140024836    3/2014

OTHER PUBLICATIONS

Introduction to Analog Layout Design Dr. S. L. Pinjare Workshop on Advanced VLSI Laboratory Cambridge Institute of Technology, Bangalore Apr. 30, 2011 Nitte Meenakshi Institute of Technology, (slides 46 & 49 of the presentation).*

(Continued)

*Primary Examiner* — Caleb Henry
*Assistant Examiner* — Alexander Belousov
(74) *Attorney, Agent, or Firm* — Jones Day

(57) ABSTRACT

A vertical gate all around (VGAA) nanowire device circuit routing structure is disclosed. The circuit routing structure comprises a plurality of VGAA nanowire devices including a NMOS and a PMOS device. The devices are formed on a semiconductor-on-insulator substrate. Each device comprises a bottom plate and a top plate wherein one of the bottom and top plates serves as a drain node and the other serves as a source node. Each device further comprises a gate layer. The gate layer fully surrounds a vertical channel in the device. In one example, a CMOS circuit is formed with an oxide (OD) block layer that serves as a common bottom plate for the NMOS and PMOS devices. In another example, a CMOS circuit is formed with a top plate that serves as a common top plate for the NMOS device and the PMOS devices. In another example, a SRAM circuit is formed.

21 Claims, 9 Drawing Sheets

(51) Int. Cl.
    *H01L 27/12*     (2006.01)
    *H01L 29/06*     (2006.01)
    *H01L 27/118*     (2006.01)
    *H01L 27/11*     (2006.01)

(52) U.S. Cl.
    CPC . *H01L 27/1104* (2013.01); *H01L 2027/11875* (2013.01); *H01L 2027/11879* (2013.01); *H01L 2027/11881* (2013.01)

(58) Field of Classification Search
    CPC ....... H01L 2027/11875; H01L 27/1104; H01L 2027/11881
    See application file for complete search history.

(56) References Cited

OTHER PUBLICATIONS

Korean Office Action; Application No. 10-2014-0183009; dated Jan. 21, 2016.
Korean Office Action; Application No. 10-2014-0183009; dated Jun. 28, 2016.

* cited by examiner

CONNECTION STRUCTURE FOR VERTICAL GATE ALL AROUND (VGAA) DEVICES ON SEMICONDUCTOR ON INSULATOR (SOI) SUBSTRATE

BACKGROUND

The technology described in this patent document relates to vertical gate all around (VGAA) transistor devices, and more specifically to connection structures for VGAA devices.

Scaling of semiconductor devices, such as a MOSFET, has enabled continued improvement in speed, performance, density, and cost per unit function of integrated circuits over the past few decades. Improvements to the layout and connection of VGAA devices can further the scaling of integrated circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
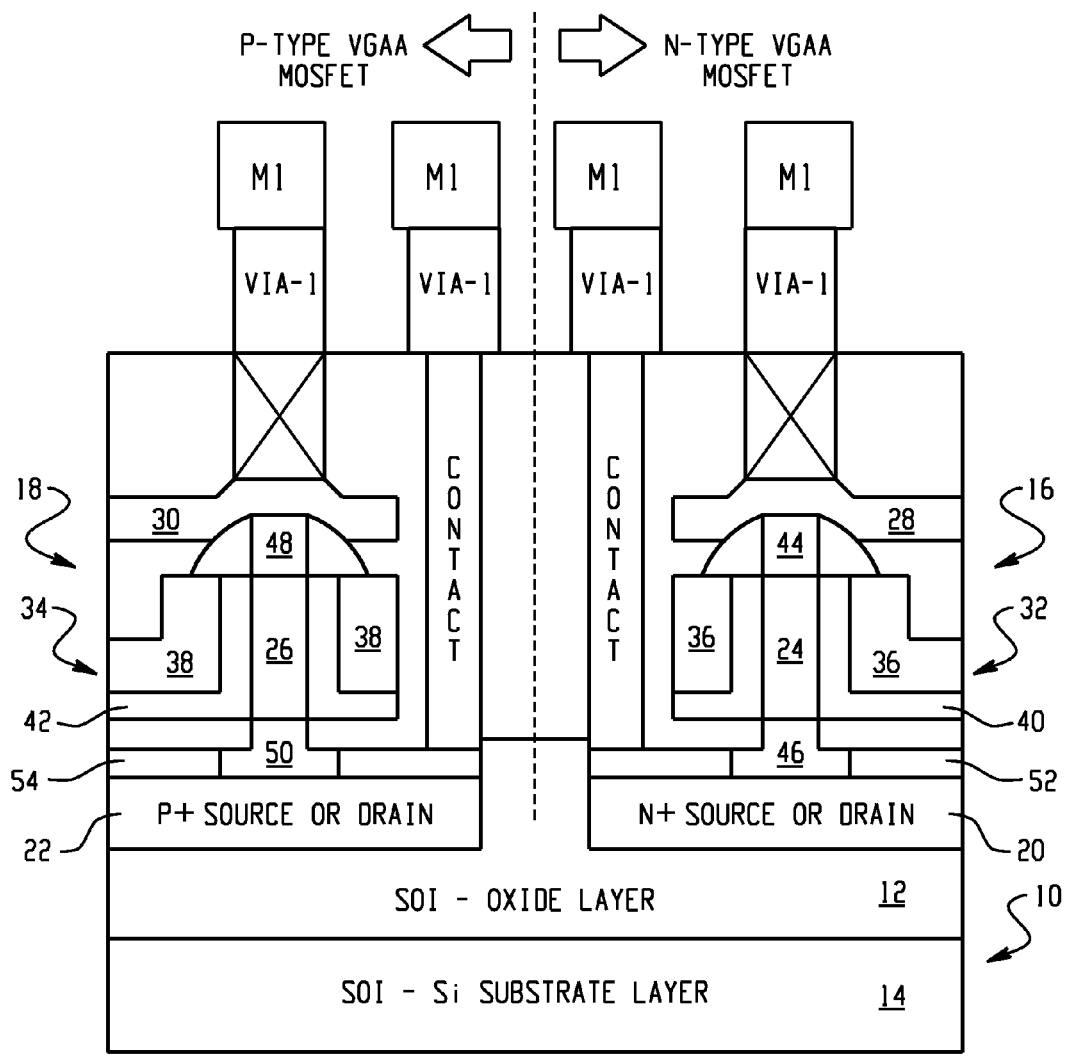
FIG. 1 depicts a cross-sectional view of an example semiconductor circuit formed on a semiconductor-on-insulator (SOI) substrate.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Vertical gate all around (VGAA) transistors can be formed with a channel that vertically extends above a substrate and a gate layer that completely surrounds a portion of the channel region above the substrate. A VGAA transistor may consist of a bottom plate on a substrate on which the source or drain may be formed, a vertically extending channel region that extends vertically above the substrate, a gate layer that surrounds at least a portion of the channel region, and a top metal plate above the channel region on which the source or drain may be formed. If the source is formed on the bottom plate, then the drain would be formed on the top plate. Alternatively, if the drain is formed on the bottom plate, then the source will be formed on the top plate. VGAA transistors of different types, such as N-type metal oxide semiconductor (NMOS) and P-type metal oxide semiconductor (PMOS) transistors, can be formed with a bottom plate, vertically extending channel region with surrounding gate, top plate structure. The substrate on which the CMOS VGAA circuit is formed may be a semiconductor-on-insulator (SOI) substrate comprising an oxide diffusion layer formed above a semiconductor material. The vertically extending channel region in a VGAA transistor may be formed from one or more nanowires or nano-pillars.

Disclosed in the following examples are example implementations where VGAA transistors of different types, i.e., NMOS and PMOS VGAA transistors, are connected together in a structure that allows them to share a top plate or a bottom plate. A connection structure where NMOS and PMOS VGAA transistors, i.e., CMOS circuits, share a top plate or a bottom plate may have a reduced surface area footprint.

FIG. 1 depicts a cross-sectional view of an example semiconductor circuit formed on a semiconductor-on-insulator (SOI) substrate 10. The SOI substrate 10 comprises an oxide diffusion layer 12 formed above semiconductor material 14. The semiconductor material 14 of the SOI substrate 10 may comprise silicon (Si), Germanium (Ge), SiGe, SiC, SiP, SiPC, SiGe with B11 doped, or III-V material on the insulator. The III-V material may be selected from the group consisting of InP, InAs, GaAs, AlInAs, InGaP, InGaAs, GaAsSb, GaPN and AlPN.

The example semiconductor circuit has two VGAA nanowire devices, a NMOS VGAA device 16 and a PMOS VGAA device 18, formed on the SOI substrate 10. Each VGAA device 16, 18 has a source or drain region 20, 22 on the substrate 10, a vertical extending channel region 24, 26 extending above the source or drain region 20, 22, and a metal plate 28, 30 above the channel region 24, 26 for the source or drain. The source/drain material of the NMOS VGAA device and the PMOS VGAA device may comprise epi growth compound material. The epi growth compound material of the NMOS VGAA may be selected from a group consisting of SiP content, or SiC content, or SiPC, or Si, or Ge, or III-V material, or a combination of the foregoing material types. The epi growth compound material used in the PMOS VGAA may be selected from a group consisting of SiGe, Ge, Ge-content, SiP, SiC or III-V material, or a combination of the foregoing material types.

The vertical extending channel regions 24, 26 may have channel doping. The doping species for the channel region 24 for the NMOS VGAA 16 may be selected from a group consisting of B11, BF2, Indium, Ge, N, C, or combination. The doping dose may be within a range of 1E12 to 5E13. The doping species for the channel region 26 for the PMOS VGAA 18 may be selected from a group consisting of P, As, Sb, Ge, N, C, or combination. The doping dose may be within a range of 1E12 to 5E13.

Each VGAA nanowire device also includes a gate stack 32, 34 surrounding the vertical extending channel regions 24, 26. Each gate stack, in this example, includes a metal layer 36, 38 disposed on a work-function metal layer (not shown). The work-function metal layer is disposed on a high-k dielectric layer 40, 42 located over the channel region 24, 26. The device high-k dielectric layer 40, 42 may be a material selected from the group consisting of $SiO_2$, SiON, $Si_3N_4$, $Ta_2O_5$, $Al_2O_3$, PEOX, TEOS, nitrogen content oxide layer, nitride oxide, Hf content oxide, Ta content oxide, Al content oxide, high K material (K>10), or a combination of the foregoing material types. The device work function may be within a range of approximately 4 eV to approximately 5 eV. The work-function metal layer may comprise a material having a chemical composition selected from the group consisting of TiN, TaN, TiAl, TaAl, Ti-content, Ta-content, Al-content, W-content, TiSi, NiSi and PtSi. The metal gate electrode material may comprise poly-Si with silicide, Al content, Cu content, W content, Ti content, Ta content, Nitrogen content, refractory material (TiN, TaN, TiW, TiAl), and metal content, among others.

For the NMOS VGAA transistor 16, N-type source/drain (S/D) formation may comprise an N-type S/D lithography patterning and doping process in LDD regions 44, 46. The doping species may be selected from a group consisting of P, As, Sb, N, C, or a combination of the foregoing material types.

For the PMOS VGAA transistor 18, P-type source/drain (S/D) formation may comprise a P-type S/D lithography patterning and doping process in LDD regions 48, 50. The doping species may be selected from a group consisting of B11, BF2, Indium, N, C, or a combination of the foregoing material types.

Each VGAA nanowire device also includes a silicide layer 52, 54 with silicide material. The silicide material may be selected from a group of Ti, Co, Ni, Mo, Pt, or a combination of the foregoing material types.

Figure 2A:
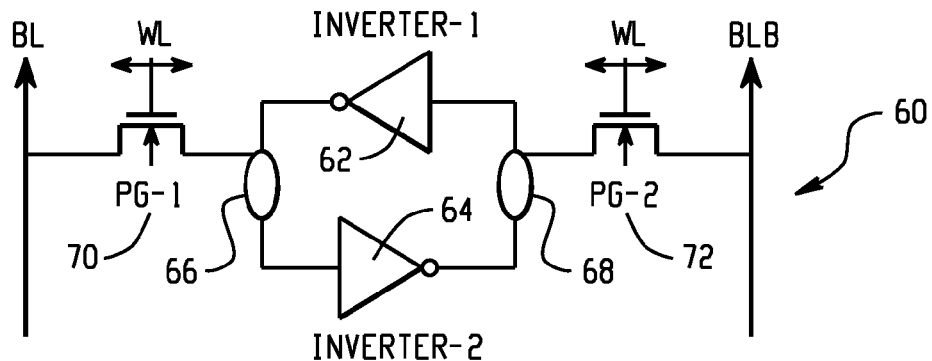
FIG. 2A depicts a schematic diagram of an example memory cell (e.g., SRAM cell) circuit that may be implemented with VGAA nanowire devices.

FIG. 2A depicts a schematic diagram of an example memory cell (e.g., SRAM cell) circuit 60 that may be implemented with VGAA nanowire devices. The example memory cell circuit includes two cross-coupled inverters 62, 64 having a data storage node 66 and a complementary data storage node 68, a first pass-gate device (PG-1) 70, and a second pass-gate device (PG-2) 72. Each pass-gate device is an NMOS device.

Figure 2B:
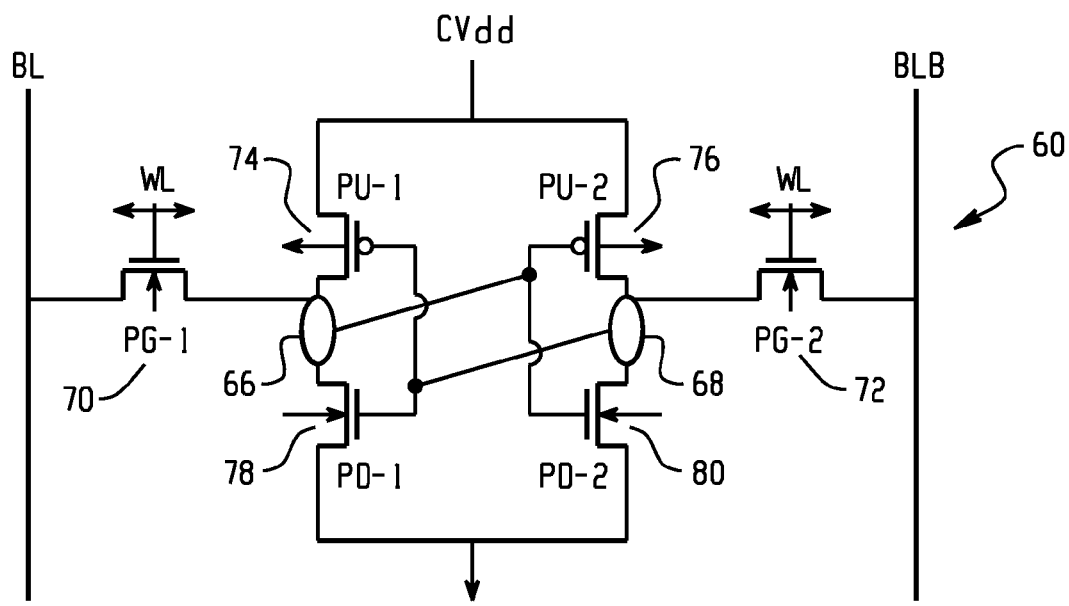
FIG. 2B depicts a schematic diagram of an alternative view of the example memory cell circuit.

FIG. 2B depict a schematic diagram of an alternative view of the example memory cell circuit 60. The example memory cell circuit includes two cross-coupled inverters having a data storage node 66 and a complementary data storage node 68, a first pass-gate device (PG-1) 70, and a second pass-gate device (PG-2) 72. In this example, each inverter comprises a PMOS transistor (PU-1 or PU-2) 74, 76 and an NMOS transistor (PD-1 or PD-2) 78, 80.

Figure 3A:
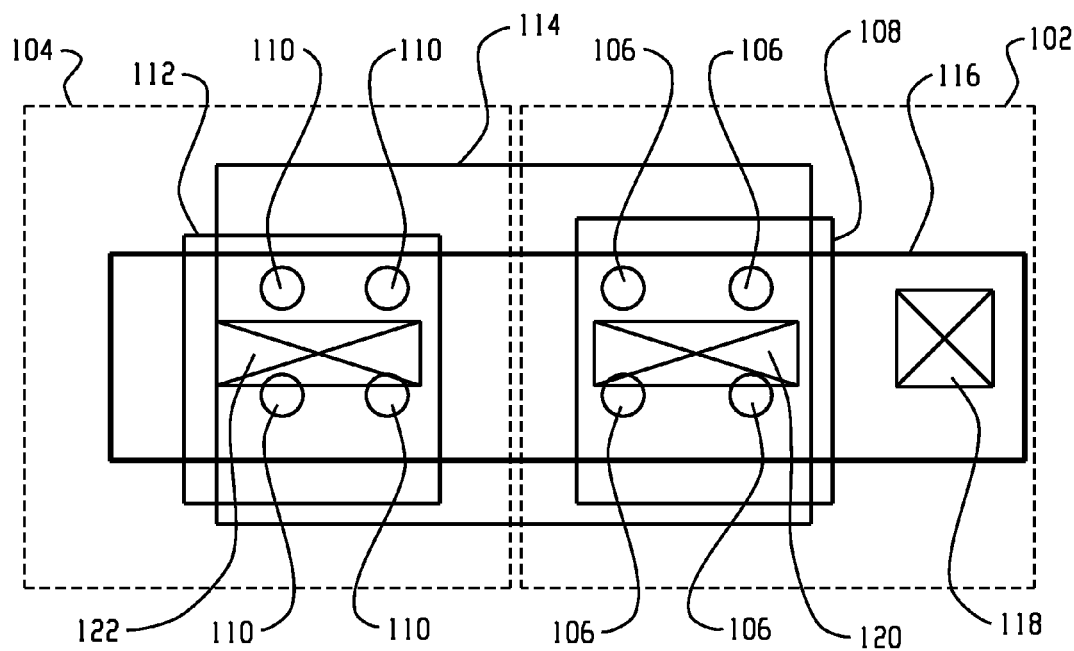
FIG. 3A is a top view of an example VGAA nanowire device circuit routing structure.

FIG. 3A is a top view of an example VGAA nanowire device circuit routing structure. The circuit routing structure in this example is for a circuit that includes an NMOS transistor and a PMOS transistor. An inverter circuit is an example of a circuit that could be implemented using this example circuit routing structure. The example circuit routing structure comprises a plurality of VGAA nanowire devices including a NMOS VGAA nanowire device in an N-type S/D doping region 102 and a PMOS VGAA nanowire device in a P-type S/D doping region 104.

Above the N-type S/D doping region 102 are four NMOS nanowire channel structures 106 and a top plate 108 for the NMOS VGAA nanowire device. Above the P-type S/D doping region 104 are four PMOS nanowire channel structures 110 and a top plate 112 for the PMOS VGAA nanowire device. The circuit routing structure in this example also includes a SOI OD region 114 that is common to both the N-type S/D doping region 102 and the P-type S/D doping region 104.

Each set of four nanowire channel structures could indicate a single transistor or a plurality of transistors in parallel. For example, each channel structure could belong to a single transistor or a single transistor could utilize the entire set (or a subset of more than one) of the four nanowire channel structures.

The vertical channels 106 in the NMOS VGAA nanowire device and the vertical channels 110 in the PMOS VGAA nanowire device may comprise a Si-based or epi growth compound material. The vertical channels 106, 110 extend in length from the corresponding source node to the corresponding drain node. The channel material of the PMOS VGAA nanowire device may comprise a Si-based or epi growth compound material selected from a group comprising: SiGe, SiGeC, Ge, Si, a type III-V compound, or a combination of one or more of the foregoing materials. The channel material of the NMOS VGAA nanowire device may comprise a Si-base or epi growth compound material selected from a group comprising: SiP, SiC, SiPC, Si, Ge, a type III-V compound, or a combination of one or more of the foregoing materials. The diameter (or width) of the nanowire vertical channel may be less than 10 nm. Each of the VGAA nanowire devices may comprise a plurality of vertical nanopillar formed channel regions extending between a common drain node and a common source node and surrounded by a common gate node in the VGAA nanowire device.

Each of the VGAA nanowire devices further comprises a gate layer with a gate electrode 116 formed around the four NMOS nanowire channel structures 106 and the four PMOS nanowire channel structures 110. The gate layer fully surrounds a vertical channel in the VGAA nanowire device and serves as a gate node. Also shown are a gate contact 118, a top plate contact 120 for the N-type S/D doping region, and a top plate contact 122 for the P-type S/D doping region.

Each of the VGAA nanowire devices in the example circuit routing structure of FIG. 3A comprises a bottom plate 114 and a top plate 108, 112 wherein one of the bottom and top plates serves as a drain node and the other of the bottom and top plates serves as a source node for the VGAA nanowire device. The first top plate 108 and the second top plate 112 may comprise a Si-based material and may further comprise a silicide layer formed on each of the first top plate 108 and the second top plate 112. One or more silicide layers may be formed on the bottom plate, i.e., OD region 114.

A CMOS circuit that may be formed by the NMOS VGAA nanowire device and the PMOS VGAA nanowire device of FIG. 3A comprises an oxide diffusion (OD) block layer 112 that serves as a common bottom plate for the NMOS VGAA nanowire device and the PMOS VGAA nanowire device. When the CMOS circuit of FIG. 3A is connected as an inverter, the OD layer 112 electrically connects the drain node of the NMOS VGAA nanowire device to the drain node of the PMOS VGAA nanowire device. The CMOS circuit further comprises a first gate layer 116 that serves as a common gate for the NMOS VGAA nanowire device and the PMOS VGAA nanowire device to electrically connect the gate node of the NMOS VGAA nanowire device to the gate node of the PMOS VGAA nanowire device. When the CMOS circuit of FIG. 3A is connected as an inverter, the CMOS circuit further comprises a first top plate 108 that may serve as the source node for the NMOS VGAA nanowire device and a second top plate 112 that may serve as the source node for the PMOS VGAA nanowire device. When the CMOS circuit of FIG. 3A is connected as an inverter the first top plate 108 is electrically connected to a Vss conductor and the second top plate 112 is electrically connected to a Vdd conductor.

Figure 3B:
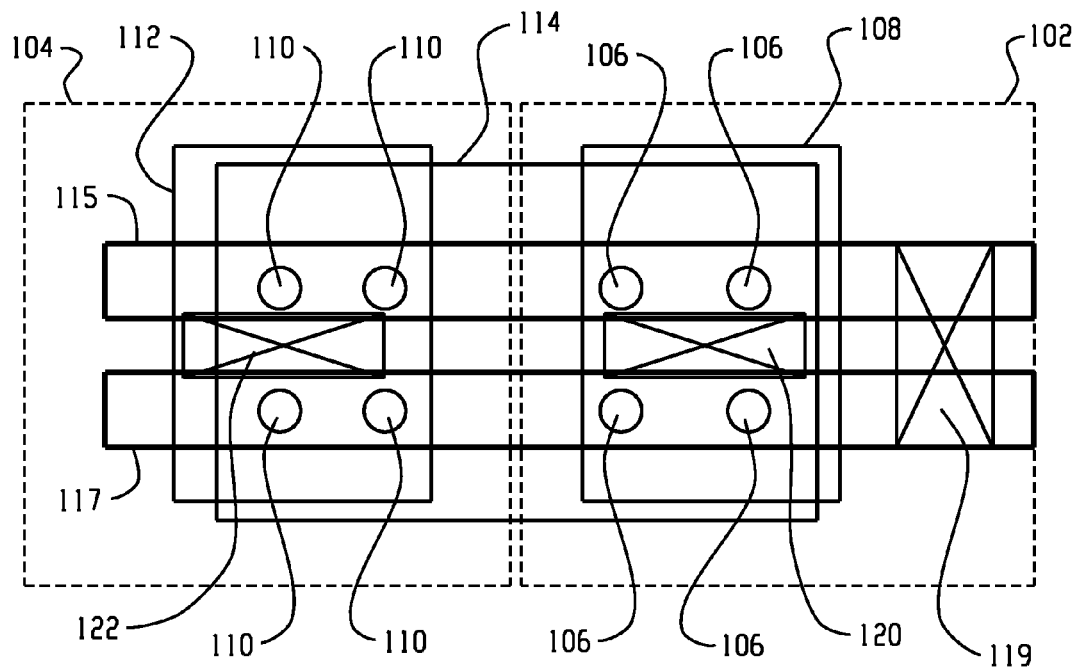
FIG. 3B is a top view of another example VGAA nanowire device circuit routing structure.

FIG. 3B is a top view of another example VGAA nanowire device circuit routing structure. The circuit routing structure of FIG. 3B is similar to that of FIG. 3A. Similar to the example circuit routing structure of FIG. 3A, the circuit routing structure of FIG. 3B includes a NMOS VGAA nanowire device in an N-type S/D doping region 102 and a PMOS VGAA nanowire device in a P-type S/D doping region 104. Above the N-type S/D doping region 102 are four NMOS nanowire channel structures 106 and a top plate 108 for the NMOS VGAA nanowire device. Above the P-type S/D doping region 104 are four PMOS nanowire channel structures 110 and a top plate 112 for the PMOS VGAA nanowire device. The circuit routing structure in this example also includes a SOI OD region 114 that is common to both the N-type S/D doping region 102 and the P-type S/D doping region 104. The example circuit routing structure also includes a top plate contact 120 for the N-type S/D doping region and a top plate contact 122 for the P-type S/D doping region.

The circuit routing structure of FIG. 3B differs from the circuit routing structure of FIG. 3A by including two separate metal gate layers 115, 117 instead of a single gate structure. Each metal gate layers 115, 117 is formed around two of the four NMOS nanowire channel structures 106 and two of the four PMOS nanowire channel structures 110. The two separate metal gate layers 115, 117 are connected together by a gate contact 119.

Figure 4A:
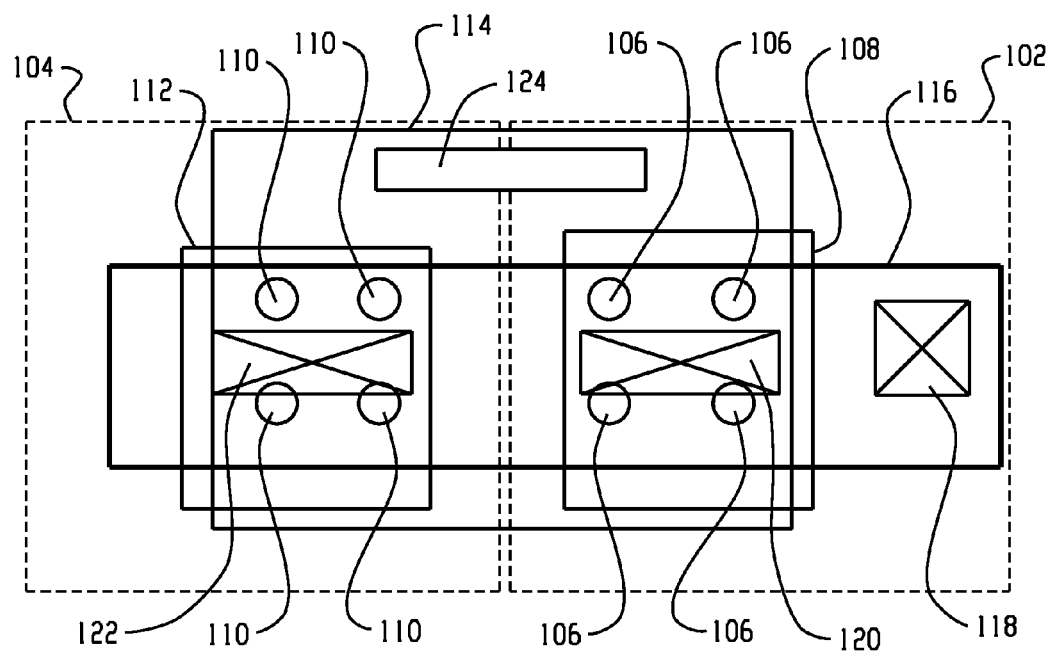
FIG. 4A is a top view of another example VGAA nanowire device circuit routing structure.

FIG. 4A is a top view of another example VGAA nanowire device circuit routing structure. The circuit routing structure of FIG. 4A is similar to that of FIG. 3A. Similar to the example circuit routing structure of FIG. 3A, the circuit routing structure of FIG. 4A includes an NMOS VGAA nanowire device in an N-type S/D doping region 102 and a PMOS VGAA nanowire device in a P-type S/D doping region 104. Above the N-type S/D doping region 102 are four NMOS nanowire channel structures 106 and a top plate 108 for the NMOS VGAA nanowire device. Above the P-type S/D doping region 104 are four PMOS nanowire channel structures 110 and a top plate 112 for the PMOS VGAA nanowire device. The circuit routing structure in this example also includes a SOI OD region 114 that is common to both the N-type S/D doping region 102 and the P-type S/D doping region 104. The example circuit routing structure also includes a common metal gate layer 116, a gate contact 118, a top plate contact 120 for the N-type S/D doping region, and a top plate contact 122 for the P-type S/D doping region. The circuit routing structure of FIG. 4A also includes a CMOS output node contact layer 124.

Figure 4B:
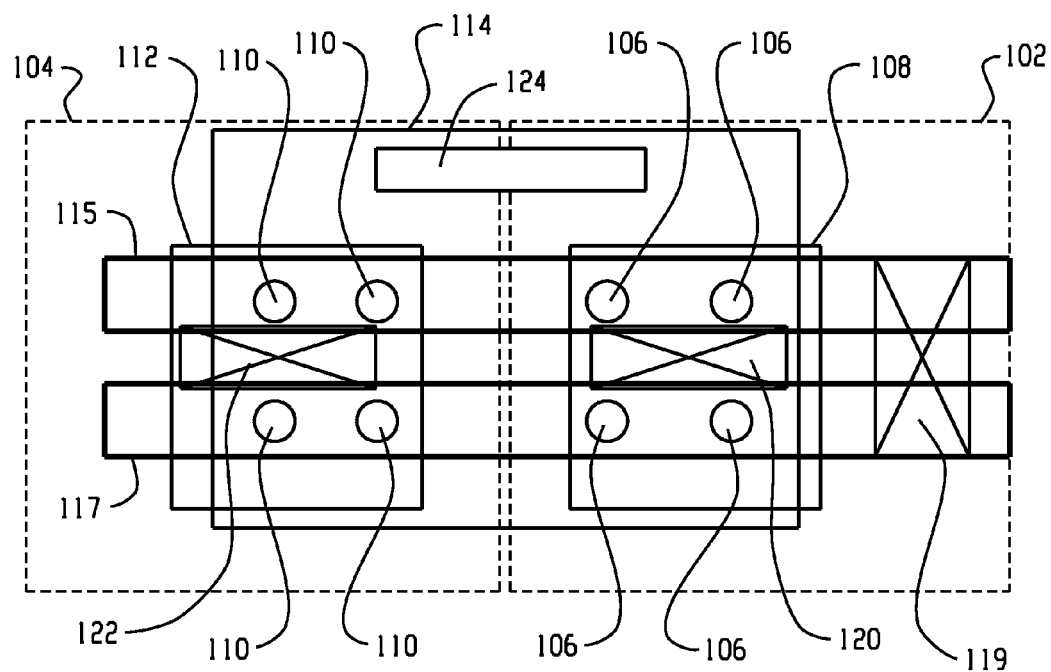
FIG. 4B is a top view of another example VGAA nanowire device circuit routing structure.

FIG. 4B is a top view of another example VGAA nanowire device circuit routing structure. The circuit routing structure of FIG. 4B is similar to that of FIG. 3B. Similar to the example circuit routing structure of FIG. 3B, the circuit routing structure of FIG. 4B includes an NMOS VGAA nanowire device in an N-type S/D doping region 102 and a PMOS VGAA nanowire device in a P-type S/D doping region 104. Above the N-type S/D doping region 102 are four NMOS nanowire channel structures 106 and a top plate 108 for the NMOS VGAA nanowire device. Above the P-type S/D doping region 104 are four PMOS nanowire channel structures 110 and a top plate 112 for the PMOS VGAA nanowire device. The circuit routing structure in this example also includes a SOI OD region 114 that is common to both the N-type S/D doping region 102 and the P-type S/D doping region 104. The example circuit routing structure also includes two separate metal gate layers 115, 117 that are connected together by a gate contact 119, a top plate contact 120 for the N-type S/D doping region, and a top plate contact 122 for the P-type S/D doping region. The circuit routing structure of FIG. 4B also includes a CMOS output node contact layer 124.

Figure 5:
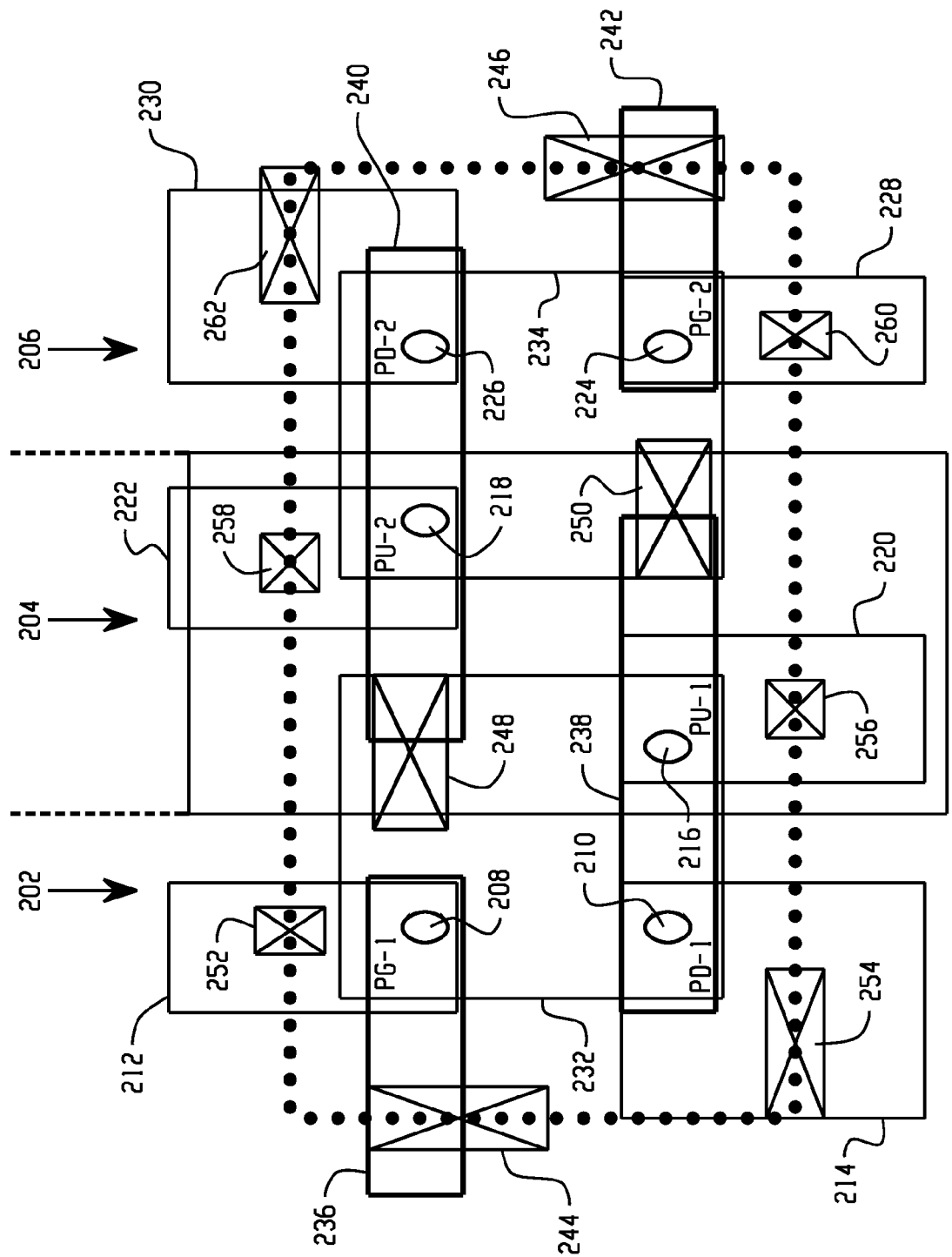
FIG. 5 is a top view of another example VGAA nanowire device circuit routing structure.

FIG. 5 is a top view of another example VGAA nanowire device circuit routing structure. The circuit routing structure in this example may be used to implement an example 6T SRAM memory cell circuit. The example circuit routing structure comprises two cross-coupled inverters having a data storage node and a complementary data storage node, a first pass-gate device (PG-1), and a second pass-gate device (PG-2). Each inverter comprises a P-type VGAA nanowire device (PU) and an N-type VGAA nanowire device (PD). Each pass-gate device is an N-type VGAA nanowire device.

The circuit routing structure in this example includes a first N-type S/D doping region 202, a P-type S/D doping region 204, and a second N-type S/D doping region 206. Above the first N-type S/D doping region 202 are a nanowire channel structure 208 for the first pass-gate device (PG-1), a nanowire channel structure 210 for the first pull-down device (PD-1), a PG-1 top plate 212, and a PD-1 top plate 214. Above the P-type S/D doping region 204 are a nanowire channel structure 216 for the first pull-up device (PU-1), a nanowire channel structure 218 for the second pull-up device (PU-2), a PU-1 top plate 220, and a PU-2 top plate 222. Above the second N-type S/D doping region 206 are a nanowire channel structure 224 for the second pass-gate device (PG-2), a nanowire channel structure 226 for the second pull-down device (PD-2), a PG-2 top plate 228, and a PD-2 top plate 230. Although not shown the top plates may comprise a silicon-based material and may further comprise a silicide layer formed on the top plates.

The circuit routing structure in this example also includes a first SOI OD region 232 that is common to both the first N-type S/D doping region 202 and the P-type S/D doping region 204 and a second SOI OD region 234 that is common to both the second N-type S/D doping region 206 and the P-type S/D doping region 204. The first SOI OD region 232, which is a bottom plate for the PG-1 transistor, the PD-1 transistor, and the PU-1 transistor, serves as a storage node. The second SOI OD region 234, which is a bottom plate for the PG-2 transistor, the PD-2 transistor, and the PU-2 transistor, serves as a complementary storage-node. The first OD region 232 and the second OD region 234 are isolated from each other. Although not shown, a silicide layer may be formed on either or both of the first OD region 232 and the second OD region 234.

Thus, each of the VGAA nanowire devices comprises a bottom plate and a top plate. One of the bottom and top plates serves as a drain node and the other of the bottom and top plates serves as a source node for the VGAA nanowire devices. In this example, the first OD region 232 serves as a common drain node for the PG-1 transistor, the PD-1 transistor, and the PU-1 transistor. The second OD region 234 serves as a common drain node the PG-2 transistor, the PD-2 transistor, and the PU-2 transistor. The six top plates— PG-1 top plate 212, PD-1 top plate 214, PU-1 top plate 220, PU-2 top plate 222, PG-2 top plate 228, and PD-2 top plate 230—are source nodes for their respective transistors.

The circuit routing structure in this example further includes a first gate electrode 236 that is formed around the PG-1 nanowire channel structure 208, a second gate electrode 238 that is formed around the PD-1 nanowire channel structure 210 and the PU-1 nanowire channel structure 216 (a first inverter), a third gate electrode 240 that is formed around the PU-2 nanowire channel structure 218 and the PD-2 nanowire channel structure 226 (a second inverter), and a fourth gate electrode 242 that is formed around the PG-2 nanowire channel structure 224. Thus, each of the VGAA nanowire devices further comprises a gate layer and each memory cell comprises four gate layers. Although not shown in the figure, the gate layer may comprise a high-K gate dielectric and a metal layer. The gate layer fully surrounds a vertical channel in the VGAA nanowire device and serves as a gate node.

Also shown are four gate contacts: a first word-line contact 244 that connects the first gate 236 to a word-line, a second word-line contact 246 that connects the fourth gate 242 to the word-line, a first butt connection module 248 that electrically connects the third gate 240 to the first OD layer 232, and a second butt connection module 250 that electrically connects the second gate 238 to the second OD layer 234. The butt connection modules may comprise a longer contact to connect a gate and an OD region or, alternatively, a longer gate contact and an OD contact (i.e., a contact landing on an OD layer) that electrically connects a gate and an OD region together.

Also shown are a top plate contact 252, 254, 256, 258, 260, and 262 for each of the six top plates 212, 214, 220, 222, 228, 230. Top plate contact 252 connects the PG-1 top plate 212 with a bit-line, top plate contact 258 connects the PU-2 top plate 222 with a Vdd conductor, and top plate contact 262 connects the PD-2 top plate 230 with a Vss conductor. Similarly, top plate contact 260 connects the PG-2 top plate 228 with a complementary bit-line, top plate contact 256 connects the PU-1 top plate 220 with a Vdd conductor, and top plate contact 254 connects the PD-1 top plate 214 with a Vss conductor.

The example circuit routing structure may be used to implement an example SRAM cell structure comprising a plurality SRAM cells. In an SRAM cell structure the top plates of the individual cells may be shared with or connected to one or more adjacent cells.

Each cell may comprise a first Vdd line, a first Vss line, a second Vss line, a bit-line, a bit-line bar and a word-line. In one arrangement, the first Vdd line, bit-line and bit-line bar may be located at a first level metal layer, and the first Vss line, second Vss line and word-line may be located at a second level metal layer, wherein the second level metal level is located above the first level metal layer. Alternatively, the word-line may be located at a first level metal layer, and the first Vdd line, first Vss line, second Vss line, bit-line and bit-line bar may be located at second level metal layer, wherein the second level metal level is located above the first level metal layer.

Figure 6:
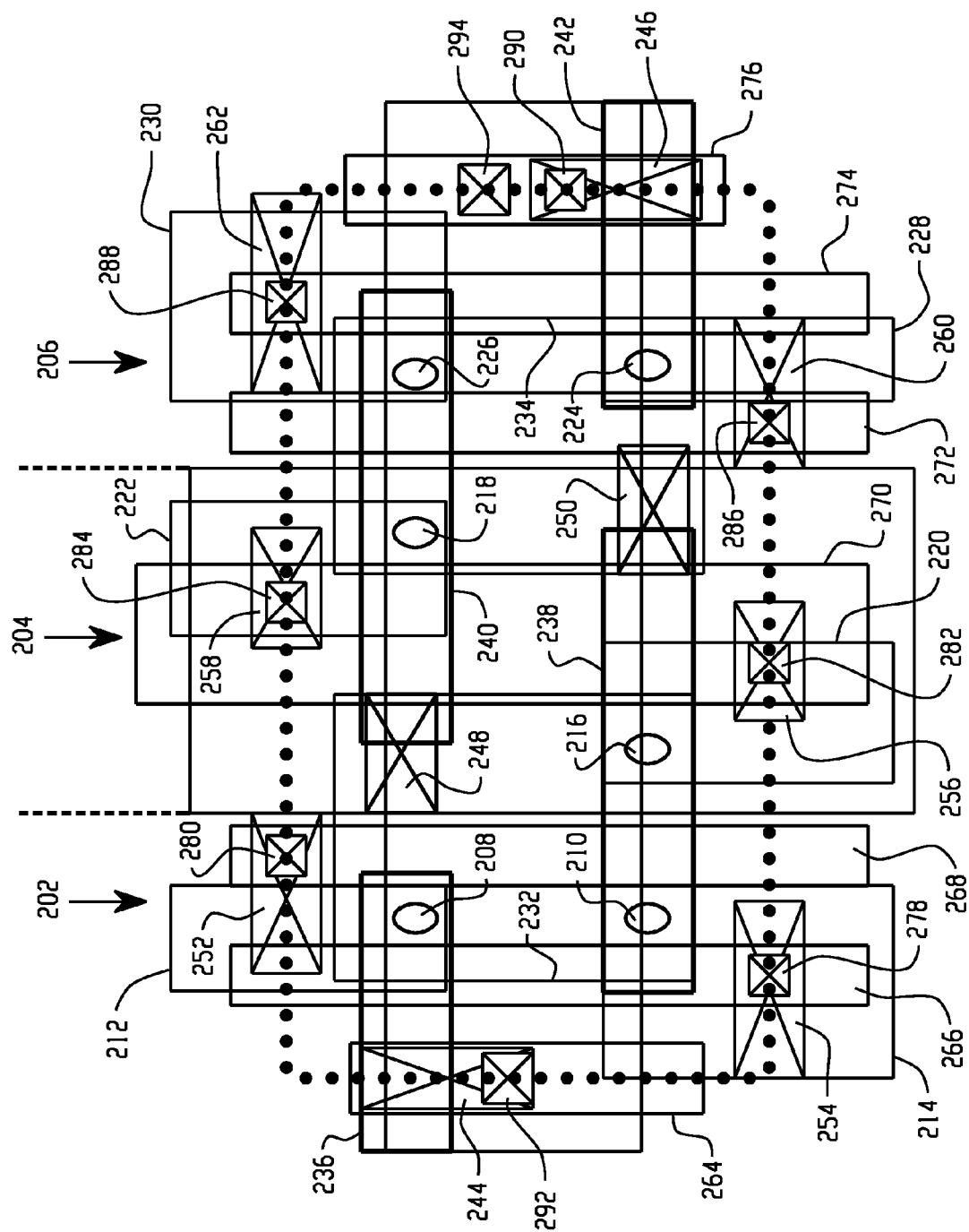
FIG. 6 is a top view of another example VGAA nanowire device circuit routing structure.

FIG. 6 is a top view of another example VGAA nanowire device circuit routing structure. The circuit routing structure of FIG. 6 is similar to that of FIG. 5 and also shows M1 metal layers 264, 266, 268, 270, 272, 274, 276, a M2 metal layer 277, via1 connections 278, 280, 282, 284, 286, 290, and via2 connections 292, 294.

Figure 7:
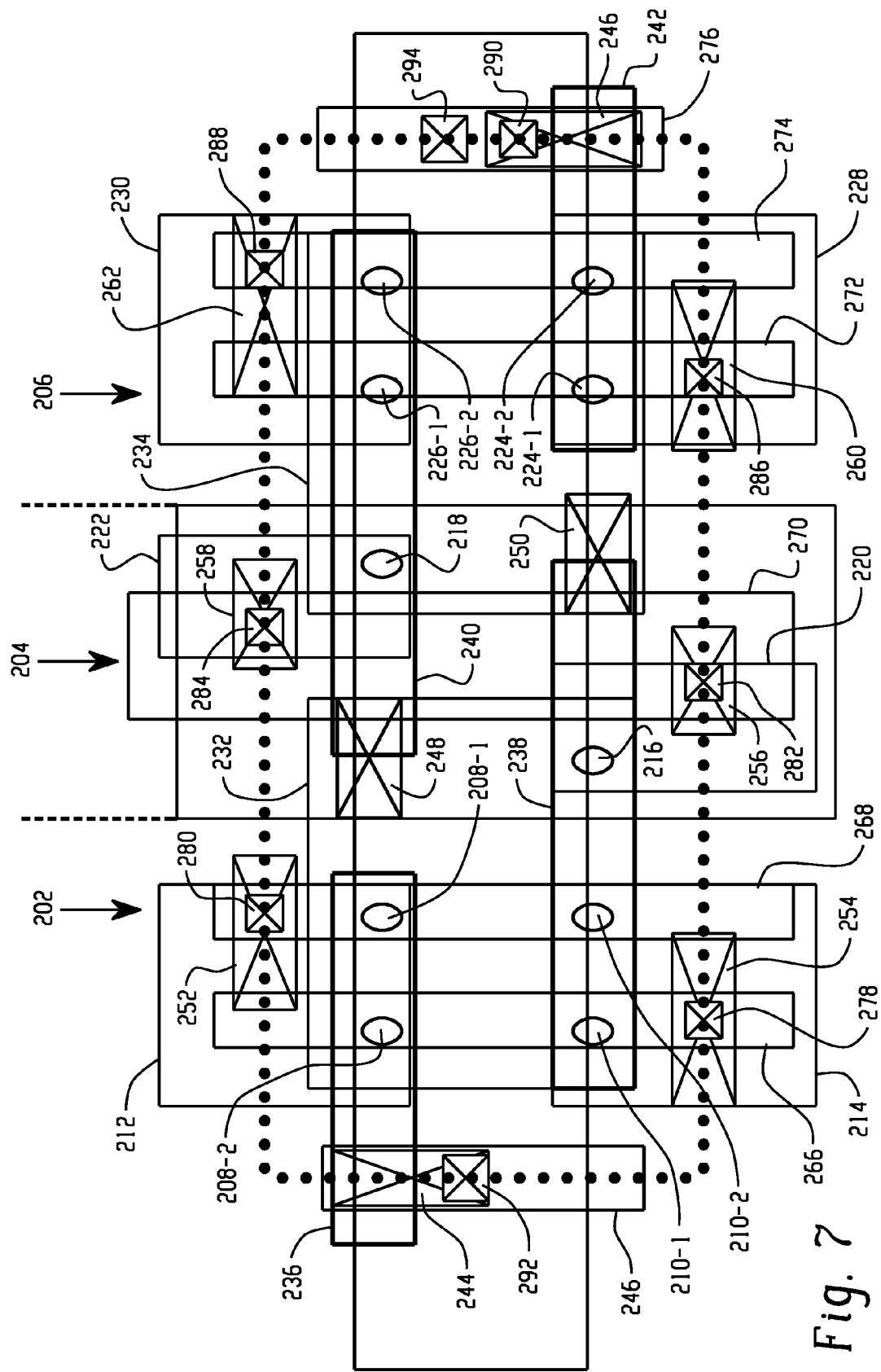
FIG. 7 is a top view of another example VGAA nanowire device circuit routing structure.

FIG. 7 is a top view of another example VGAA nanowire device circuit routing structure. The circuit routing structure of FIG. 7 is similar to that of FIG. 6 but also shows NMOS VGAA transistors with two nanowire channel structures: PG-1 transistor with channel structures 208-1, 208-2, PD-1 transistor with channel structures 210-1, 210-2, PG-2 transistor with channel structures 224-1, 224-2, and PD-1 transistor with channel structures 226-1, 226-2. In this example, the PMOS VGAA transistors have a single nanowire channel structure.

Figure 8A:
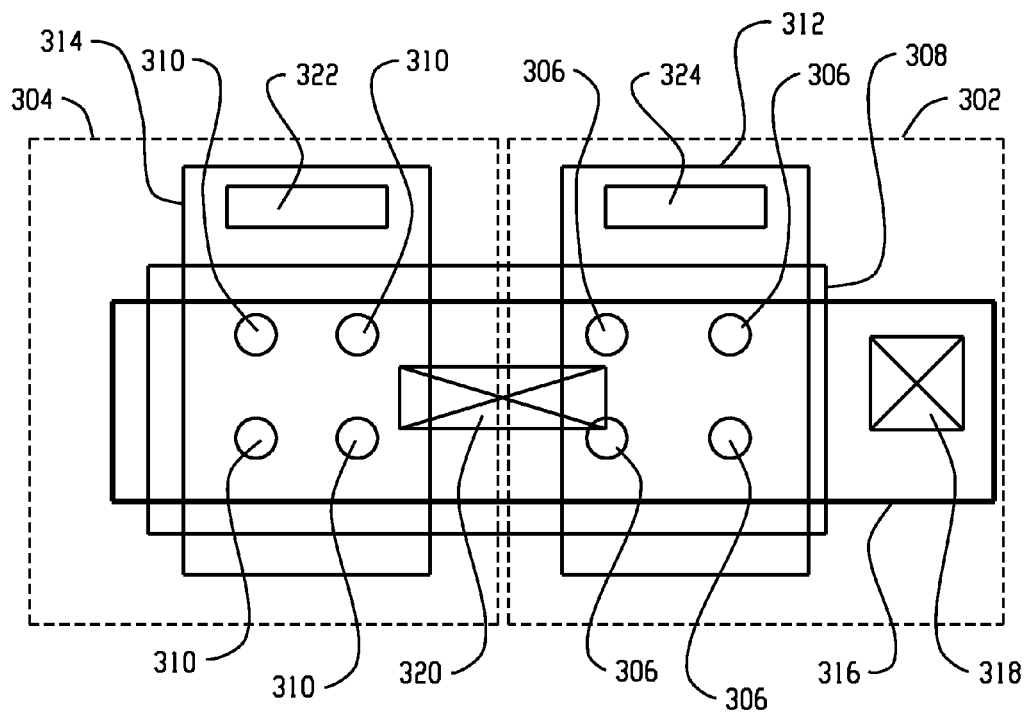
FIG. 8A is a top view of an example VGAA nanowire device circuit routing structure for a CMOS circuit containing four parallel PMOS VGAA transistors and four parallel NMOS VGAA transistors.

FIG. 8A is a top view of an example VGAA nanowire device circuit routing structure for a CMOS circuit containing four parallel PMOS VGAA transistors and four parallel NMOS VGAA transistors. In this example, the eight transistors share a common top plate (i.e., drain node). The four parallel PMOS VGAA transistors share a common bottom plate (SOI OD region and source node) and the four parallel NMOS VGAA transistors share a common bottom plate (SOI OD region and source node).

The circuit routing structure of FIG. 8A includes an NMOS VGAA nanowire device in an N-type S/D doping region 302 and a PMOS VGAA nanowire device in a P-type S/D doping region 304. Above the N-type S/D doping region 302 are four NMOS nanowire channel structures 306 for the NMOS VGAA nanowire devices and a common top plate 308. Above the P-type S/D doping region 304 are four PMOS nanowire channel structures 310 for the PMOS VGAA nanowire devices and the common top plate 308 that are common to both the N-type S/D doping region 302 and the P-type S/D doping region 304. The circuit routing structure in this example also includes a SOI OD region 312 in the N-type S/D doping region 302 and a SOI OD region 314 in the P-type S/D doping region 304. The example circuit routing structure also includes a metal gate electrode 316 in a gate layer, a gate contact 318 and a top plate contact 320. The circuit routing structure of FIG. 8A also includes a Vdd node contact layer 322 and a Vss node contact layer 324.

Each VGAA nanowire device comprises a gate layer 316 fully surrounding a vertical channel 306, 310 to serve as the gate node. The gate layer 316 may comprise a high-K gate dielectric (not shown) and one or more metal layers, such as a metal layer disposed on a work-function metal layer.

A CMOSFET may be formed by the combination of the N-type VGAA device 302 and the P-type VGAA device 304. The common top plate 308 in this example is a silicon-based block that electrically connects together the drain nodes of the N-type VGAA device 302 and the P-type VGAA device 304. The common top plate 308 may comprise silicide formed on the top plate.

The gate layer 316 is a common gate to electrically connect together the gate nodes of the N-type VGAA device 302 and P-type VGAA device 304. The OD region 312 serves as the N-type VGAA device source node and is electrically connected to a Vss conductor. The OD region 314 serves as the P-type VGAA device source node and is electrically connected to a Vdd conductor. The OD region 314 and the OD region 312 may have silicide formed on top of them.

The vertically extending nanowire channel structures 306, 310 may be formed from a silicon-based material and extend in a lengthwise direction between the source and drain regions. Each VGAA nanowire device may comprise a plurality of vertical nano-pillar formed channel regions and have common drain, source and gate nodes.

Figure 8B:
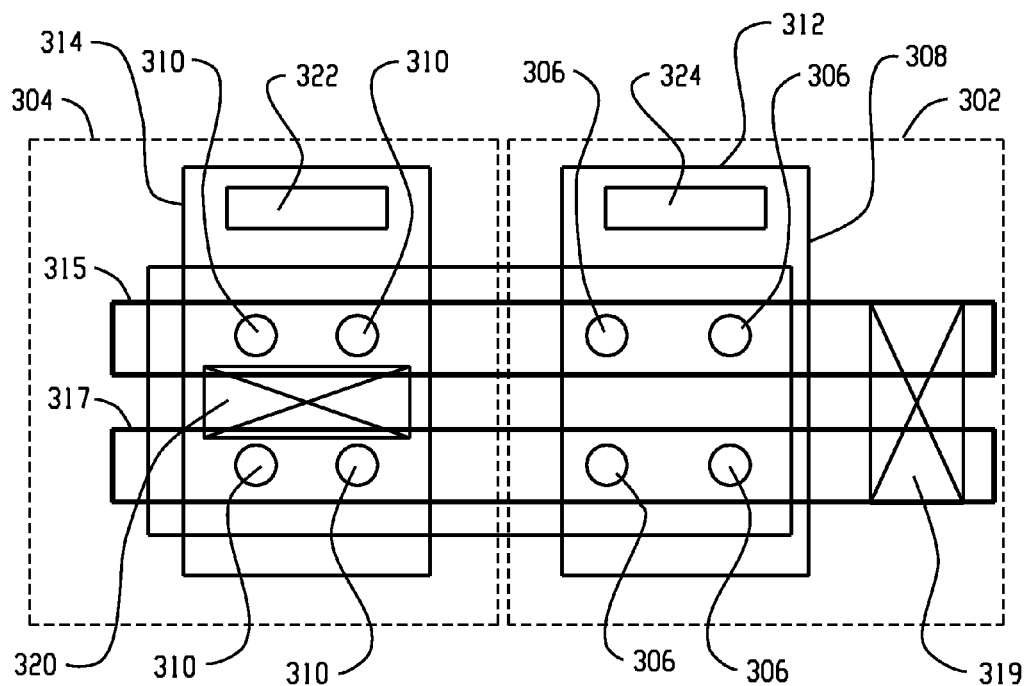
FIG. 8B is a top view of another example VGAA nanowire device circuit routing structure for a CMOS circuit containing four parallel PMOS VGAA transistors and four parallel NMOS VGAA transistors.

FIG. 8B is a top view of another example VGAA nanowire device circuit routing structure for a CMOS circuit containing four parallel PMOS VGAA transistors and four parallel NMOS VGAA transistors. In this example, the eight transistors share a common top plate (i.e., drain node). The four parallel PMOS VGAA transistors share a common bottom plate (SOI OD region and source node) and the four parallel NMOS VGAA transistors share a common bottom plate (SOI OD region and source node).

The circuit routing structure of FIG. 8B is similar to the circuit routing structure of FIG. 8A and includes an NMOS VGAA nanowire device in an N-type S/D doping region 302 and a PMOS VGAA nanowire device in a P-type S/D doping region 304. Above the N-type S/D doping region 302 are four NMOS nanowire channel structures 306 for the NMOS VGAA nanowire devices and a common top plate 308. Above the P-type S/D doping region 304 are four PMOS nanowire channel structures 310 for the PMOS VGAA nanowire devices and the common top plate 308 that are common to both the N-type S/D doping region 302 and the P-type S/D doping region 304. The circuit routing structure in this example also includes a SOI OD region 312 in the N-type S/D doping region 302 and a SOI OD region 314 in the P-type S/D doping region 304. The circuit routing structure of FIG. 8B also includes a top plate contact 320, a Vdd node contact layer 322, and a Vss node contact layer 324. The example circuit routing structure differs from that of FIG. 8A in that the example circuit structure of FIG. 8B also includes two metal gate electrodes 315, 317 and a gate contact 319 that connects the two metal gate electrodes together.

Figure 9:
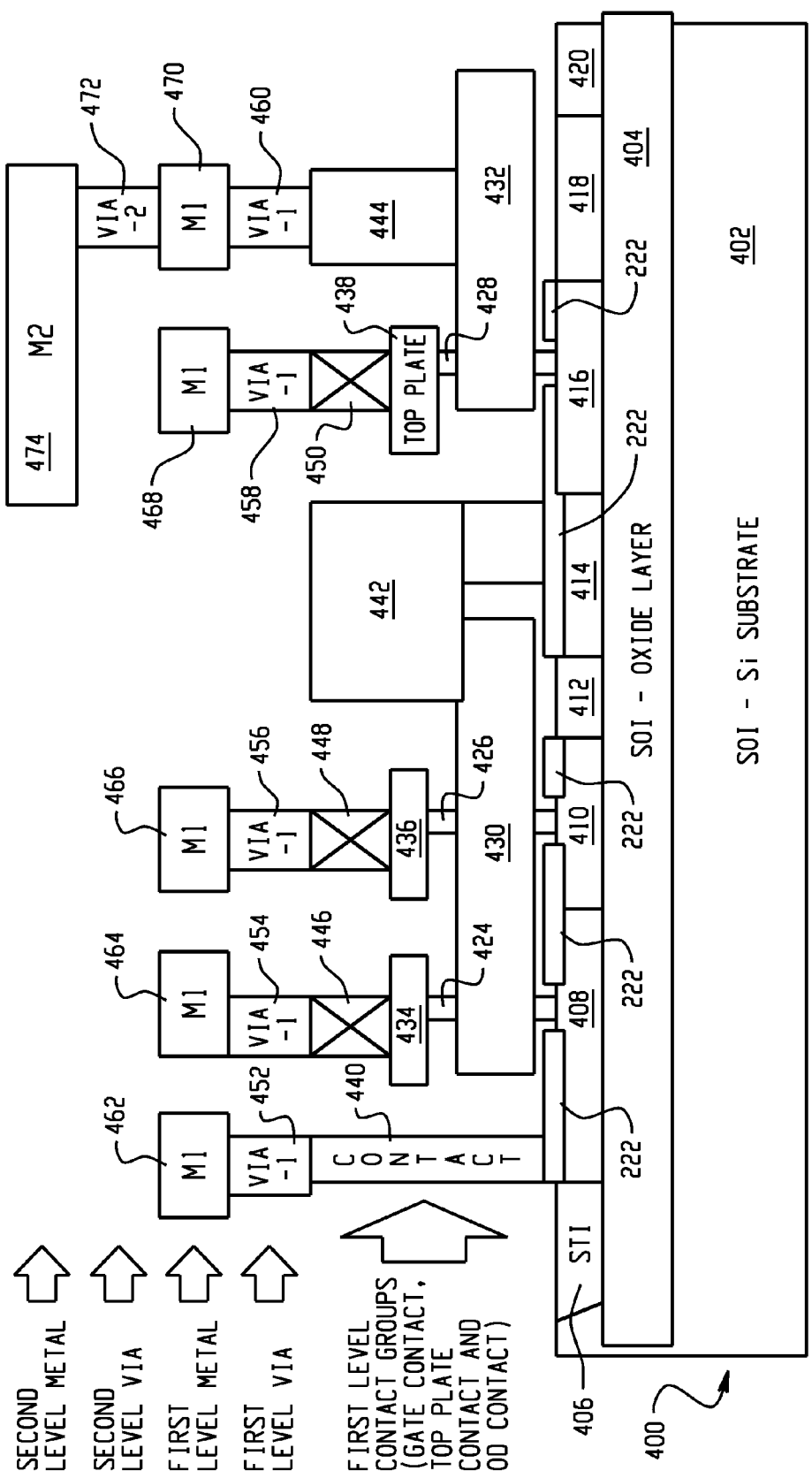
FIG. 9 is a cross-sectional view of an example circuit containing VGAA devices.

FIG. 9 is a cross-sectional view of an example circuit containing VGAA devices. Shown is a SOI substrate 400 containing a Si substrate 402 and an oxide diffusion layer (e.g., a bottom plate) 404. Formed above the oxide diffusion layer are an STI region 406, a N+ drain region 408, a P+ drain region 410, an oxide region 412, a second P+ drain region 414, a second N+ drain region 416, a second oxide region 418 and a third N+ drain region 420. Also shown are silicide regions 422 above the P+ and N+ drain regions. Above the substrate are a first vertical channel 424, a second vertical channel 426, and a third vertical channel 428. Surrounding the first and second vertical channels is a first gate 430. Surrounding the third vertical channel is a second gate 432. A first top plate 434 is provided above the first vertical channel. A second top plate 436 is provided above the second vertical channel. A third top plate 438 is provided above the third vertical channel. Also provided are a contact 440 that connects to the silicide above the N+ drain region 408, a butt contact 442 that connects the first gate 430 with the silicide above the second P+ drain region 414 and the second N+ drain region 416, a gate contact 444 above the second gate 432, a first top plate contact 446 above the first top plate 434, a second top plate contact 448 above the second top plate 436, and a third top plate contact 450 above the third top plate 438.

First level vias (Via-1) are provided above the contacts. A first via-1 452 is provided above the contact 440, a second via-1 454 is provided above the first top plate contact 446, a third via-1 456 is provided above the second top plate contact 448, a fourth via-1 458 is provided above the third top plate contact 450, and a fifth via-1 460 is provided above the gate contact 444.

First level metal (M1) contacts are provided above the first level vias. A first M1 contact 462 is provided above the first via-1 452, a second M1 contact 464 is provided above the second via-1 454, a third M1 contact 466 is provided above the third via-1 456, a fourth M1 contact 468 is provided above the fourth via-1 458, and a fifth M1 contact 470 is provided above the fifth via-1 460. Finally, a second level via (Via-2) 472 is provided above the fifth M1 contact 470, and a second level metal (M2) contact 474 is provided above the Via-2 472.

The foregoing examples may provide a VGAA nanowire device with connection solutions that may result in memory cell size reduction and a surface area reduction for CMOS logic circuits.

In one embodiment, disclosed is a vertical gate all around (VGAA) nanowire device circuit routing structure. The circuit routing structure comprises a plurality of VGAA nanowire devices including a NMOS VGAA nanowire device and a PMOS VGAA nanowire device. The VGAA nanowire devices are formed on a semiconductor-on-insulator (SOI) substrate. Each of the VGAA nanowire devices comprises a bottom plate and a top plate wherein one of the bottom and top plates serves as a drain node and the other of the bottom and top plates serves as a source node for the VGAA nanowire device. Each of the VGAA nanowire devices further comprises a gate layer. The gate layer comprises a high-K gate dielectric and a metal layer. The gate layer fully surrounds a vertical channel in the VGAA nanowire device and serves as a gate node. A CMOS circuit is formed by the NMOS VGAA nanowire device and the PMOS VGAA nanowire device. The CMOS circuit comprises an oxide diffusion (OD) block layer that serves as a common bottom plate for the NMOS VGAA nanowire device and the PMOS VGAA nanowire device to electrically connect the drain node of the NMOS VGAA nanowire device to the drain node of the PMOS VGAA nanowire device. The CMOS circuit further comprises a first gate layer that serves as a common gate for the NMOS VGAA nanowire device and the PMOS VGAA nanowire device to electrically connect the gate node of the NMOS VGAA nanowire device to the gate node of the PMOS VGAA nanowire device. The CMOS circuit further comprises a first top plate that serves as the source node for the NMOS VGAA nanowire device and a second top plate that serves as the source node for the PMOS VGAA nanowire device, wherein the first top plate is electrically connected to a Vss conductor and the second top plate is electrically connected to a Vdd conductor.

In another embodiment, a memory cell structure is disclosed. The memory cell comprises a plurality memory cells. Each memory cell comprises two cross-coupled inverters having a data storage node and a complementary data storage node. Each inverter comprises a P-type VGAA nanowire pull-up device and an N-type VGAA nanowire pull-down device. Each memory cell further comprises first and second pass-gate devices. Each pass-gate device comprises an N-type VGAA nanowire device. The P-type and N-type VGAA devices are formed on a semiconductor-on-insulator (SOI) substrate. Each of the VGAA nanowire devices comprises a bottom plate and a top plate wherein one of the bottom and top plates serves as a drain node and the other of the bottom and top plates serves as a source node for the VGAA nanowire device. Each of the VGAA nanowire devices further comprises a gate layer. The gate layer comprises a high-K gate dielectric and a metal layer. The gate layer fully surrounds a vertical channel in the VGAA nanowire device and serves as a gate node. Each cell comprises an oxide diffusion (OD) block layer comprising two isolated OD blocks. A first OD block is a first common bottom plate for a first pull-down VGAA device, a first pull-up VGAA device and a first pass-gate VGAA device. A second OD block is a common bottom plate for a second pull-down VGAA device, a second pull-up VGAA device and a second pass-gate VGAA device. Each cell comprises four gate layers. A first gate layer is the gate node of the first inverter. A second gate layer is the gate node of the second inverter. A third gate layer is the gate node of the first pass-gate device. A fourth gate layer is the gate node of the second pass-gate device.

In yet another embodiment, a vertical gate all around (VGAA) nanowire device circuit routing structure is disclosed. The circuit routing structure comprises a plurality of VGAA nanowire devices including a NMOS VGAA nanowire device and a PMOS VGAA nanowire device. The VGAA nanowire devices are formed on a semiconductor-on-insulator (SOI) substrate. Each of the VGAA nanowire devices comprises a bottom plate and a top plate wherein one of the bottom and top plates serves as a drain node and the other of the bottom and top plates serves as a source node for the VGAA nanowire device. Each of the VGAA nanowire devices further comprises a gate layer. The gate layer comprises a high-K gate dielectric and a metal layer. The gate layer fully surrounds a vertical channel in the VGAA nanowire device and serves as a gate node. A CMOS circuit formed by the NMOS VGAA nanowire device and the PMOS VGAA nanowire device. The CMOS circuit comprises a silicon-based block as a common top plate for the NMOS VGAA nanowire device and the PMOS VGAA nanowire device to electrically connect the drain nodes of the NMOS VGAA nanowire device and the PMOS VGAA nanowire device together. The CMOS circuit comprises a gate layer that serves as a common gate for the NMOS VGAA nanowire device and the PMOS VGAA nanowire device to electrically connect the gate node of the NMOS VGAA nanowire device to the gate node of the PMOS VGAA nanowire device. The CMOS circuit comprises a first OD layer that serves as the source node for the NMOS VGAA nanowire device and a second OD layer that serves as the source node for the PMOS VGAA nanowire device, wherein the first OD layer is electrically connected to a Vss conductor and the second OD layer is electrically connected to a Vdd conductor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A vertical gate all around (VGAA) nanowire device circuit routing structure, the circuit routing structure comprising:
   a plurality of VGAA nanowire devices including a NMOS VGAA nanowire device and a PMOS VGAA nanowire device, the VGAA nanowire devices being formed on a semiconductor-on-insulator (SOI) substrate, each of the VGAA nanowire devices comprising a bottom plate and a top plate wherein one of the bottom and top plates serves as a drain node and the other of the bottom and top plates serves as a source node, each of the VGAA nanowire devices further comprising a gate layer, the gate layer comprising a high-K gate dielectric and a metal layer, the gate layer fully surrounding a vertical channel in the VGAA nanowire device and serving as a gate node, wherein the NMOS VGAA nanowire device comprises a first nanowire having a first height, a first width, and a first depth, and the PMOS VGAA nanowire device comprises a second nanowire having a second height, a second width, and a second depth; and
   a CMOS circuit formed by the NMOS VGAA nanowire device and the PMOS VGAA nanowire device, the CMOS circuit comprising a common bottom plate shared by the NMOS VGAA nanowire device and the PMOS VGAA nanowire device, the common bottom plate electrically coupling the drain node of the NMOS VGAA nanowire device to the drain node of the PMOS VGAA nanowire device, the CMOS circuit further comprising a first gate layer that serves as a common gate for the NMOS VGAA nanowire device and the PMOS VGAA nanowire device to electrically connect the gate node of the NMOS VGAA nanowire device to the gate node of the PMOS VGAA nanowire device, the CMOS circuit further comprising a first top plate that serves as the source node for the NMOS VGAA nanowire device and a second top plate that serves as the source node for the PMOS VGAA nanowire device, wherein the first top plate is electrically connected to a Vss conductor via a first contact formed over the first top plate and has a width that is greater than the first width and a depth that is greater than the first depth, and the second top plate is electrically connected to a Vdd conductor via a second contact formed above the second top plate and has a width that is greater than the second width and a depth that is greater than the second depth.

2. The routing structure of claim 1, further comprising a silicide layer formed on the common bottom plate.

3. The routing structure of claim 1, wherein each of the first top plate and the second top plate comprises a silicide layer formed on each of the first top plate and the second top plate.

4. The routing structure of claim 1, wherein the vertical channel in each of the NMOS VGAA nanowire device and the PMOS VGAA nanowire device comprises a Si-based or epi growth compound material and extends in length from the corresponding source node to the corresponding drain node.

5. The routing structure of claim 4, wherein the channel material of the PMOS VGAA nanowire device comprises a Si-based or epi growth compound material selected from a group comprising: SiGe, SiGeC, Ge, Si, a type III-V compound, or a combination of one or more of the foregoing materials.

6. The routing structure of claim 4, wherein the channel material of the NMOS VGAA nanowire device comprises a Si-base or epi growth compound material selected from a group comprising: SiP, SiC, SiPC, Si, Ge, a type III-V compound, or a combination of one or more of the foregoing materials.

7. The routing structure of claim 4, wherein the diameter (or width) of the nanowire vertical channel is less than 10 nm.

8. The routing structure of claim 4, wherein each of the VGAA nanowire devices comprises a plurality of vertical nano-pillar formed channel regions extending between a common drain node and a common source node and surrounded by a common gate node in the VGAA nanowire device.

9. The cell structure of claim 8, wherein the top plate comprises a silicide layer formed on the top plate layer.

10. The cell structure of claim 8, wherein each cell further comprises a first Vdd line, a first Vss line, a second Vss line, a bit-line, a bit-line bar and a word-line, the first Vdd line, wherein the bit-line and the bit-line bar are located at a first level metal layer, and wherein the first Vss line, the second Vss line and the word-line are located at second level metal layer, wherein the second level metal layer is located above the first level metal layer.

11. The cell structure of claim 8, wherein each cell further comprises a first Vdd line, a first Vss line, a second Vss line, a bit-line, a bit-line bar and a word-line, the first Vdd line, wherein the word-line is located at a first level metal layer, wherein the first Vdd line, the first Vss line, the second Vss line, the bit-line and the bit-line bar are located at a second level metal layer, and wherein the second level metal layer is located above the first level metal layer.

12. A memory cell structure, comprising:
a plurality of memory cells, each memory cell comprising two cross-coupled inverters having a data storage node and a complementary data storage node, each inverter comprising a P-type VGAA nanowire pull-up (PU) device, an N-type VGAA nanowire pull-down (PD) device, and first and second pass-gate (PG) devices, each pass-gate device being an N-type VGAA nanowire device, wherein the P-type and N-type VGAA nanowire devices are formed on a semiconductor-on-insulator (SOT) substrate, each of the VGAA nanowire devices comprising (i) a gate layer including a high-K gate dielectric and a metal layer, (ii) a nanowire having a first height, a first width, and a first depth, (iii) a bottom plate, (iv) a top plate having a second width that is greater than the first width and a second depth that is greater than the first depth, wherein one of the bottom and top plates serves as a drain node and the other of the bottom and top plates serves as a source node for the VGAA nanowire device, and (v) a contact formed over the top plate;
each cell comprising (i) a first common bottom plate of a first pull-down (PD-1) VGAA device, a first pull-up (PU-1) VGAA device, and a first pass-gate (PG-1) VGAA device, and (ii) a second common bottom plate of a second pull-down (PD-2) VGAA device, a second pull-up (PU-2) VGAA device, and a second pass-gate (PG-2) VGAA device;
each cell comprising four gate layers, a first gate layer comprising a gate node of the first inverter, a second gate layer comprising a gate node of the second inverter, a third gate layer comprising a gate node of the first pass-gate device and a fourth gate layer comprising a gate node of the second pass-gate device.

13. The cell structure of claim 12, wherein each cell further comprises six silicon based top plates, a first top plate being a source node of the PD-1 VGAA device and electrically connected to a first Vss conductor, a second top plate being the source node of the PD-2 VGAA device and electrically connected to a second Vss conductor, a third top plate being the source node of the PU-1 VGAA device and electrically connected to a Vdd conductor, a fourth top plate being a source node of the PU-2 VGAA device and electrically connected to the Vdd conductor, a fifth top plate as a source node of the PG-1 VGAA device and electrically connected to a bit-line conductor, and a sixth top plate being a source node of the PG-2 VGAA device and electrically connected to the complementary bit-line conductor.

14. The cell structure of claim 13, wherein the top plates are all shared with an adjacent cell.

15. The cell structure of claim 12, further comprising a first butt connection module to electrically connect the first gate layer and the second common bottom plate together, and a second butt connection module to electrically connect the second gate layer and the first common bottom plate together.

16. The cell structure of claim 15, wherein the butt connection model comprises a longer contact to connect a gate to a common bottom plate, or comprises a longer gate contact and a bottom plate contact electrically connected together.

17. The cell structure of claim 12, further comprising a silicide layer formed on the first common bottom plate and the second common bottom plate.

18. A vertical gate all around (VGAA) nanowire device circuit routing structure, comprising:
a plurality of VGAA nanowire devices including a NMOS VGAA nanowire device and a PMOS VGAA nanowire device, the VGAA nanowire devices having been formed on a semiconductor-on-insulator (SOI) substrate, each VGAA nanowire device comprising a bottom plate and a top plate wherein one of the bottom and top plates serves as a drain node and the other of the bottom and top plates serves as a source node, each VGAA nanowire device further comprising a gate layer, the gate layer comprising a high-K gate dielectric and a metal layer, the gate layer fully surrounding a vertical channel in the VGAA nanowire device and serving as a gate node; and
a CMOS circuit formed by the NMOS VGAA nanowire device and the PMOS VGAA nanowire device, the CMOS circuit further comprising a common top plate that includes a silicon-based block shared by the NMOS VGAA nanowire device and the PMOS VGAA nanowire device, the silicon-based block electrically coupling a drain node of the NMOS VGAA nanowire device to a drain node of the PMOS VGAA nanowire device, the CMOS circuit comprising a gate layer that serves as a common gate for the NMOS VGAA nanowire device and the PMOS VGAA nanowire device, the CMOS circuit comprising a first bottom plate that serves as the source node for the NMOS VGAA nanowire device and a second bottom plate that serves as the source node for the PMOS VGAA nanowire device, wherein the first bottom plate is electrically connected to a Vss conductor and the second bottom plate is electrically connected to a Vdd conductor.

19. The routing structure of claim 18, wherein a silicide layer is formed on the first and second bottom plates and on the common top plate.

20. The routing structure of claim 18, wherein the vertical channel in each VGAA nanowire device comprises a silicon-based material and extends lengthwise from a source region to a drain region in the VGAA nanowire device.

21. The routing structure of claim 18, wherein
the first and second bottom plates are formed a first distance above the SOI substrate, and
the silicon-based block is formed a second distance above the SOI substrate, the second distance being greater than the first distance.

\* \* \* \* \*